US009305745B2

(12) United States Patent
Mori et al.

(10) Patent No.: US 9,305,745 B2
(45) Date of Patent: Apr. 5, 2016

(54) SCANNING ELECTRON MICROSCOPE

(71) Applicant: HITACHI HIGH-TECHNOLOGIES CORPORATION, Tokyo (JP)

(72) Inventors: Wataru Mori, Tokyo (JP); Hiroyuki Ito, Tokyo (JP); Yuko Sasaki, Tokyo (JP); Hiromi Inada, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/379,733

(22) PCT Filed: Feb. 15, 2013

(86) PCT No.: PCT/JP2013/053608
§ 371 (c)(1),
(2) Date: Aug. 19, 2014

(87) PCT Pub. No.: WO2013/129125
PCT Pub. Date: Sep. 6, 2013

(65) Prior Publication Data
US 2015/0034824 A1  Feb. 5, 2015

(30) Foreign Application Priority Data

Feb. 28, 2012  (JP) .................................. 2012-040863

(51) Int. Cl.
*H01J 37/00* (2006.01)
*H01J 37/28* (2006.01)
(Continued)

(52) U.S. Cl.
CPC ................. *H01J 37/28* (2013.01); *H01J 37/05* (2013.01); *H01J 37/244* (2013.01); *H01J 37/09* (2013.01); *H01J 2237/2801* (2013.01); *H01J 2237/2806* (2013.01)

(58) Field of Classification Search
CPC .. H01J 37/05; H01J 2237/057; H01J 2237/28
USPC .................................................. 250/306–311
See application file for complete search history.

(56) References Cited

U.S. PATENT DOCUMENTS 4,740,704 A * 4/1988 Rose et al. ............. 250/396 ML
6,239,430 B1 * 5/2001 Weimer et al. ................ 250/305
(Continued)

FOREIGN PATENT DOCUMENTS

JP       09-270241 A      10/1997
JP       11-238484 A       8/1999
(Continued)

OTHER PUBLICATIONS

International Search Report issued in International Application No. PCT/JP2013/053608 with Date of mailing Apr. 2, 2013, with English Translation.

*Primary Examiner* — Michael Maskell
(74) *Attorney, Agent, or Firm* — McDermott Will & Emery LLP

(57) ABSTRACT

The purpose of the present invention is to provide a scanning electron microscope that achieves an increase in both resolution and pattern recognition capability. In order to achieve the purpose, the present invention proposes a scanning electron microscope provided with a monochromator that makes an electron beam monochromatic, the monochromator including a magnetic field generator that deflects the electron beam, and an energy selection aperture that passes a part of the electron beam deflected by the magnetic field generator. An aperture that passes some of electrons emitted from the sample and a detector that detects the electrons that have passed through the aperture are disposed on a trajectory to which the electrons emitted from the sample are deflected by a magnetic field generated by the magnetic field generator.

9 Claims, 3 Drawing Sheets

(51) Int. Cl.
*H01J 37/05* (2006.01)
*H01J 37/244* (2006.01)
*H01J 37/09* (2006.01)

(56) References Cited

U.S. PATENT DOCUMENTS 6,310,341 B1 * 10/2001 Todokoro et al. ............. 250/305
7,612,336 B2    11/2009 Mori et al.
2004/0075053 A1 * 4/2004 Preikszas et al. ............. 250/310
2007/0181805 A1 * 8/2007 Mori et al. ................... 250/310
2010/0044565 A1    2/2010 Mori et al.

FOREIGN PATENT DOCUMENTS

| JP | 2004-134386 A | | 4/2004 |
| JP | 2007-184139 A | | 7/2007 |
| JP | 2010-182596 A | * | 2/2009 |
| JP | 2010-182596 A | | 8/2010 |

* cited by examiner

SCANNING ELECTRON MICROSCOPE

RELATED APPLICATIONS

This application is the U.S. National Phase application under 35 U.S.C. §371, of international Application No. PCT/JP2013/053608, filed on Feb. 15, 2013, which in turn claims the benefit of Japanese Application No. 2012-040863 filed on Feb. 28, 2012, the disclosure of which Application is incorporated by reference herein.

TECHNICAL FIELD

The present invention relates to a monochromator and a scanning electron microscope capable of making an electron beam emitted from an electron source monochromatic, particularly to a monochromator and a scanning electron microscope that enable energy discrimination of electrons emitted from a sample.

BACKGROUND ART

Semiconductor devices as one type of the object of measurement or inspection by the scanning electron microscope are becoming increasingly miniaturized, requiring ever higher resolution from the scanning electron microscope. Patent Literature 1 discloses a monochromator that enables an increase in resolution. The monochromator disperses the energy of an electron beam, and selectively acquires electrons having specific energy, thus making it possible to render the beam monochromatic. Patent Literature 2 discloses a scanning electron microscope including a multiple prisms chain disposed in the beam path for aberration suppression. The microscope detects secondary electrons separated from the electron beam trajectory by utilizing the deflecting action of the multiple prism chain.

CITATION LIST

Patent Literature

Patent Literature 1: JP 2007-184139 A (corresponding to U.S. Pat. No. 7,612,336)
Patent Literature 2: JPH 9-270241 A

SUMMARY OF INVENTION

Technical Problem

Semiconductor devices are also being provided with increasingly higher aspect ratios, as well as becoming miniaturized. For example, contact holes are becoming deeper, with the aspect ratio of 30 or higher being offered. Patterns in which a plurality of materials coexist in a contact hole have also appeared in conjunction with an increase in the number of stacked layers. Thus, the electron microscope is required to have the capability to identify and measure such patterns formed with different materials. Namely, the device for measuring and inspecting the latest semiconductor devices is required to have both higher resolution and the ability to identify pattern composition. While Patent Literatures 1 and 2 disclose techniques for realizing higher resolution through suppression of aberrations by isolating a single color, for example, there are no disclosures as to the identification and measurement of a pattern having different compositions.

In the following, a scanning electron microscope with the purpose of achieving an increase in both resolution and pattern recognition capability will be described.

Solution to Problem

In order to achieve the object, there is proposed, in one aspect, a scanning electron microscope comprising an electron source and a monochromator that makes an electron beam emitted from the electron source monochromatic, characterized in that: the monochromator includes a magnetic field generator that deflects the electron beam, and an energy selection aperture that passes a part of the electron beam deflected by the magnetic field generator; and an aperture that passes some of electrons emitted from a sample and a detector that detects the electrons that have passed through the aperture are disposed on a trajectory to which the electrons emitted from the sample are deflected by a magnetic field generated by the magnetic field generator when the sample is irradiated with the electron beam that has passed through the monochromator.

Advantageous Effects of Invention

According to the above configuration, an increase in both resolution and pattern recognition capability can be achieved.

DESCRIPTION OF EMBODIMENTS

Figure 1:
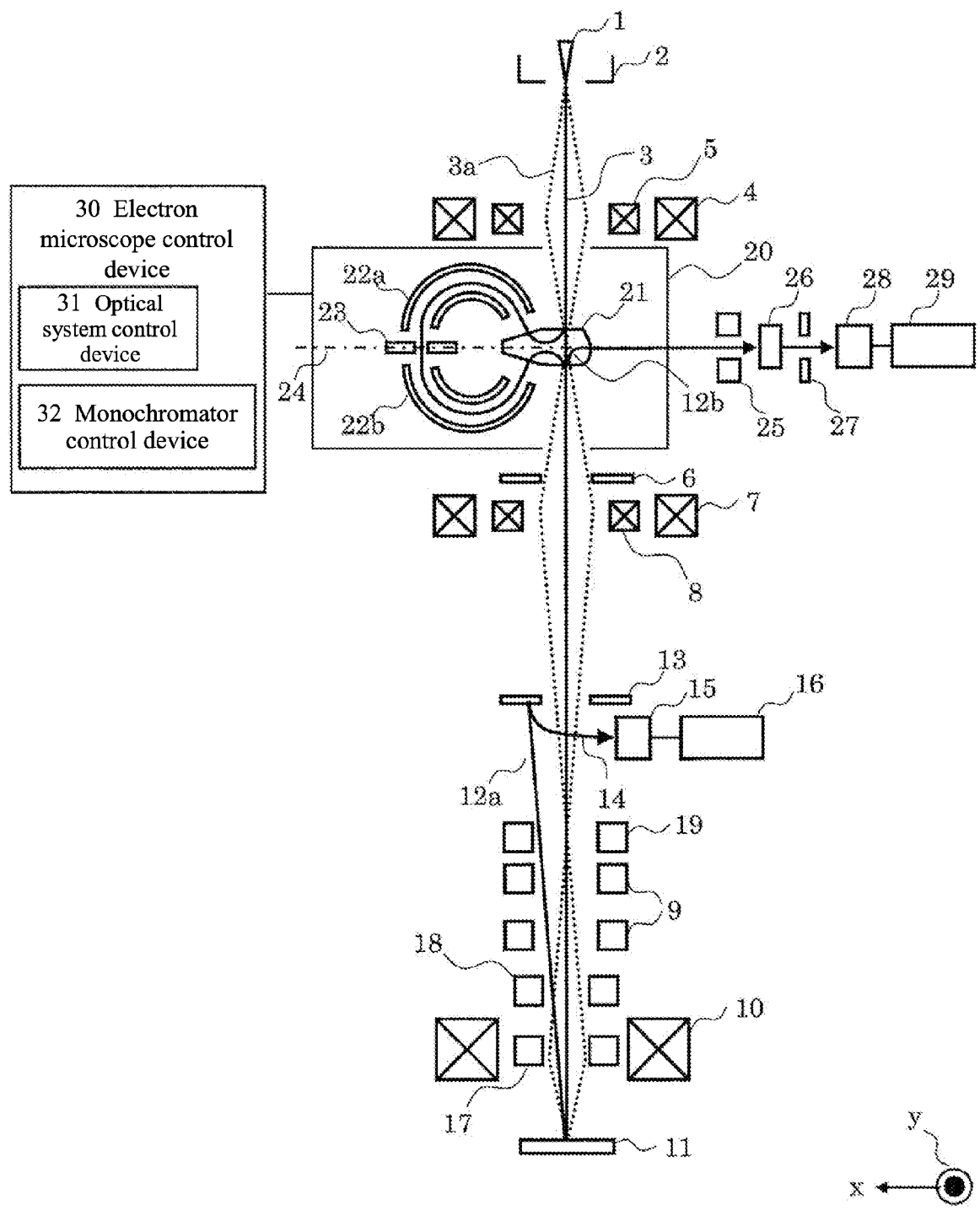
FIG. 1 illustrates an example of a scanning electron microscope provided with a monochromator.

In order to enable a scanning electron microscope (SEM) to form a compositional image with very high resolution and compositional contrast sensitivity, it is necessary to use an electron beam with low acceleration energy on the order of several keV or lower, to minimize the region in which reflected electrons/backscattered electrons (BSE) having sample composition information are emitted, and to detect the BSE and the like within a solid angle of approximately 15° with respect to the electron beam (primary electron beam) incident on the sample. When a sample of a high aspect structure is observed, some of the electrons emitted from the bottom surface of the sample collide with a side wall of the sample and therefore cannot be detected. Thus, it is necessary to efficiently detect the electrons within the solid angle of several degrees from the optical axis of the primary electron beam, so that the sample can be observed as a scanning electron microscope image (SEM image). In addition, when there is a fine potential difference on the sample, such as in the case of a p-n junction, the electrons emitted from the sample have different energies. Thus, if the energies could be discriminated, a potential region can be determined.

A method for increasing the resolution of a low acceleration SEM is provided by a scanning electron microscope with a monochromator that solves the problem of the inability to obtain a sufficiently small spot diameter because of blurring due to chromatic aberration, and that selectively passes only a desired energy range with respect to the primary electron beam.

Meanwhile, in order to increase the pattern recognition capability as described above, an image with high compositional contrast needs to be formed. The electrons emitted from the sample may have various emission energies depending on the sample composition. Thus, the compositional contrast can be enhanced by selectively detecting the electrons having specific energy through energy discrimination.

Means for performing such energy discrimination includes an energy filter. The energy filter comprises a plurality of mesh electrodes overlapped in the optical axis direction, for example. The energy filter forms an inverse electric field with respect to the electrons emitted from the sample so as to repel electrons with lower energy while selectively detecting electrons with greater energy. However, while the filter can block the weak electrons, it cannot selectively detect the weak electrons, or to select electrons in a specific range of energy width.

For example, when a pattern comprising three materials A, B, and C is formed in a contact hole, where the materials emit electrons of an energy relationship such that A>B>C, the energy filter selectively passes only the electrons with greater energy. Thus, although the energy filter can selectively detect only the electrons emitted from A, or only the electrons emitted from A and B, it cannot selectively detect only the electrons emitted from C or only the electrons emitted from B and C. It is desirable that the device for measuring the latest semiconductor devices with increasingly higher aspect and having an increasing number of stacked layers be capable of selectively detecting the electrons with relatively weak energy.

With reference to the embodiment described below, a description will be given of a scanning electron microscope provided with a monochromator and capable of forming a highly accurate compositional contrast image in a relatively simple configuration without mesh electrodes and the like.

A description will also be given of a scanning electron microscope capable of measuring a pattern comprising a plurality of materials contained in a sample having a high aspect structure by enabling both a selective detection of electrons emitted from a solid angle of several degrees from the optical axis of the primary electron beam, and energy discrimination.

According to the present embodiment, particularly a scanning electron microscope will be described in which an increase in resolution is achieved by isolation of a single color, and in which the contrast of an SEM image of a bottom surface of a high aspect structure sample is improved and a fine potential difference is determined through detection of the electrons emitted from the sample in a specific solid angle and through an energy discrimination function. More specifically, a description will be given of a scanning electron microscope provided with a monochromator that makes electron beam energy monochromatic and with a function to detect the electrons emitted from the sample in a specific solid angle and to discriminate the energy.

Further, the present embodiment is configured such that, in order to decrease the required number of components, a magnetic field generator disposed in the monochromator for deflecting the primary electron beam toward an electric field generator is also used for deflecting the electrons emitted from the sample. The electrons deflected in a direction opposite to the primary electron beam are subjected to energy discrimination and detected by a detector, such as a scintillator and a photomultiplier, to provide an SEM image.

The operation of the scanning electron microscope provided with the monochromator according to the present embodiment will be described with reference to FIG. 1. When an extraction voltage is applied between an electron source 1 and an anode electrode 2, a primary electron beam 3 is emitted from the electron source 1 along a linear optical axis. The primary electron beam 3 includes a primary electron beam 3a expanding to several tens of mrad. An astigmatism-corrected real image of the electron source 1 is converged to a point by a first convergence lens 4 and a first astigmatism correcting lens 5 at a point of intersection with a symmetrical plane 24 of the monochromator.

Thereafter, the primary electron beam 3 from the electron source 1 is deflected by approximately 160° by a magnetic field generator 21 of a front-stage deflecting system to an energy selection aperture 23, and is then deflected by the same angle by a first electric field generator 22a in the opposite direction. The deflection directs the beam in a direction parallel with the original linear optical axis. The beam is then energy-dispersed in the x-direction at the position of the energy selection aperture 23 disposed in an energy dispersion plane, and converged in the y-direction. Then, the beam is converged to a point while drawing a symmetrical plane trajectory by a second electric field generator 22b of a latter-stage deflecting system that is installed at a symmetrical position with respect to the plane including the deflects energy selection aperture 23 and configured to return the primary electron beam 3 to the linear optical axis of the electron beam, and by the magnetic field generator 21, thus cancelling the energy dispersion caused by the front-stage deflecting system and forming a non-dispersed virtual image. The virtual image of the electron source 1 that has been made single-color (monochromatic) is formed by a second convergence lens 8 and then reduced in size by an objective lens 10, forming a fine cross-over on the surface of the sample 11. At this time, the opening angle of the primary electron beam 3 or the amount of current of the primary electron beam is limited by an aperture 6 installed between the monochromator 20 and the objective lens 10. The primary electron beam 3 is further caused to scan the sample two-dimensionally by two stages of a deflector 9 using an electrostatic field.

Electrons 12 emitted from the sample (secondary electrons and/or reflected electrons) travel upward while being subjected to the lens action of the objective lens 10. An acceleration electrode 17 to which a positive electric field can be applied is installed so as to pull the emitted electrons further up toward the detector. There is also provided the function to apply positive and negative voltages to the sample 11. When a positive voltage is applied, the electrons emitted from the sample can be drawn back to the sample so that only the electrons with a specific energy can be guided toward the detector. On the other hand, when a negative voltage is applied, the electrons can be further accelerated and pulled up toward the detector. The application voltage for the acceleration electrode 17 and the application voltage for the sample 11 are controlled by an optical system control device 31 in the electron microscope control device 30 for each energy of the electrons as the object of detection.

For sample observation without using the monochromator, or for automatic adjustment of the monochromator operation condition, collision with a scintillator 15 to which a high positive voltage is applied produces light emission, which is converted into an electric signal and amplified by a photomultiplier 16 so as to enable observation of a scanning electron microscope image (SEM image). In FIG. 1, the electrons 12a as they rise are caused to collide with a conversion electrode 13, thus newly producing secondary electrons 14 which are detected. However, the electrons 12a may be directly detected. The conversion electrode 13 or the detector is disposed between the magnetic field generator 21 and the sample 11, and functions as an aperture (second aperture) that limits the passage of the electrons in a range of angles greater than a predetermined radiation angle with respect to the optical axis of the primary electron beam 3 as the center. For example, when a contact hole is measured, of the electrons emitted from the hole bottom, a larger amount of electrons is emitted in a narrow angle range than in a wide angle range. Thus, by limiting the passage of the electrons emitted at the wide angle, the electrons detected by a detector 29 (first detector) provide enhanced information of the hole bottom.

When an SEM image is formed using a photomultiplier 29 disposed in the latter stage of the monochromator, the electrons 12b emitted from the sample 11 are returned by an auxiliary deflector 19 in the same trajectory as the primary electron beam, and are then deflected by the magnetic field generator 21 disposed in the monochromator 20 in a direction opposite to that of the primary electron beam.

The emitted electrons 12b are emitted at a certain solid angle with respect to the linear optical axis of the primary electron beam. Thus, the convergence of the electrons can be adjusted by the electron convergence lens 18 so that the electrons can pass through the opening of the conversion electrode 13 for passing the primary electron beam and the aperture 6.

The deflected electrons 12b pass through an auxiliary deflector 25 capable of X-Y two-dimensional scan and a limiting aperture 27 (first aperture), which are disposed between the monochromator 20 and a scintillator 28. The electrons 12b then collide with the scintillator 28 to which a high positive voltage is applied, producing light, which is converted by the photomultiplier 29 into an electric signal and amplified so that the signal can be observed as a scanning electron microscope image (SEM image). The auxiliary deflector 25 can be axially adjusted with respect to the axis of the limiting aperture 27. Thus, by adjusting the diameter of the limiting aperture 27, only the electrons that have been radiated in a certain desired solid angle from the optical axis can be detected and observed as the SEM image.

Further, by taking advantage of the energy dispersion caused by the deflection by the magnetic field generator 21, energy discrimination by electron energy-loss spectroscopy (EELS), for example, may be performed by an energy sensitive analyzer 26 disposed between the auxiliary deflector 25 and the limiting aperture 27. Further, in order to selectively detect electrons of a desired energy, the deflected electrons 12b may be scanned at the limiting aperture 27 using the auxiliary deflector 25 disposed between the magnetic field generator 21 and the aperture 27, and an image can be formed in predetermined energy units. Namely, the electrons may be detected in units of the aforementioned material A, material B, and material C, so that the respective images can be created. Further, there may be provided an operating device that determines whether, by performing the scan, the detected amount of electrons of a specific energy exceeds a predetermined threshold value. For example, when a resist residue is present at the hole bottom and if the energy of the electrons emitted from the resist is known, a program for indicating the presence or absence of the residue based on whether the electrons of the energy is detected, or whether an image of the resist residue is formed upon detection of the electrons of the energy, may be stored in a memory of the operating device, which is not shown.

The operating device also performs an operation for forming a composed image by composing the outputs from the detector 16 and the detector 29. For example, the image formed based on the electrons detected by the detector 29 strongly reflects specific composition information of the hole bottom, while the image based on the electrons detected by the detector 16 strongly reflects surface information of the hole. Thus, when it is desired to observe the hole bottom, since the information of the hole surface is not required, an image process such that the hole surface information is canceled may be implemented, whereby the hole bottom information can be enhanced.

The device according to the present embodiment is capable of acquiring images respectively enhancing the information of material A, material B, and material C. Thus, the composing ratio may be varied in accordance with the purpose of measurement or inspection. The operating unit is provided with the function for forming a line profile from the image and measuring a peak-to-peak dimension of the profile. Thus, when it is desired to measure the dimension between material A and material C, for example, the ratio of their information may be increased while the ratio of the other information may be relatively decreased when the image composition is performed. In this way, the peak height for material A and material C can be enhanced, whereby measurement accuracy can be increased.

The yoke edge of the magnetic field generator 21 and the analyzer 26 are provided with a convergence function for converging the deflected electrons 12b. The yoke edge surface of the magnetic field generator 21 is shaped in a vertical plane with respect to the electrons input/output axis, thus providing a structure for suppressing the development of contributing aberration.

As described above, it is possible to perform energy discrimination in addition to the observation of an SEM image based on those of the electrons emitted from the sample that are within a desired solid angle, in a high resolution state achieved by the monochromator and using a combination of the energy sensitive analyzer 26 and the limiting aperture 27. The limiting aperture 27 may be configured to be movable so that the electrons of a desired energy can be selectively detected.

In the configuration illustrated in FIG. 1, the magnetic field generator 21 of the monochromator 20 is used as a deflector for guiding the electrons emitted from the sample toward the detector and also as an energy dispersion unit for causing energy dispersion. Thus, the number of components disposed within a vacuum chamber can be decreased, thus simplifying the structure while at the same time achieving high resolution and high energy resolution of the detected electrons.

Figure 2:
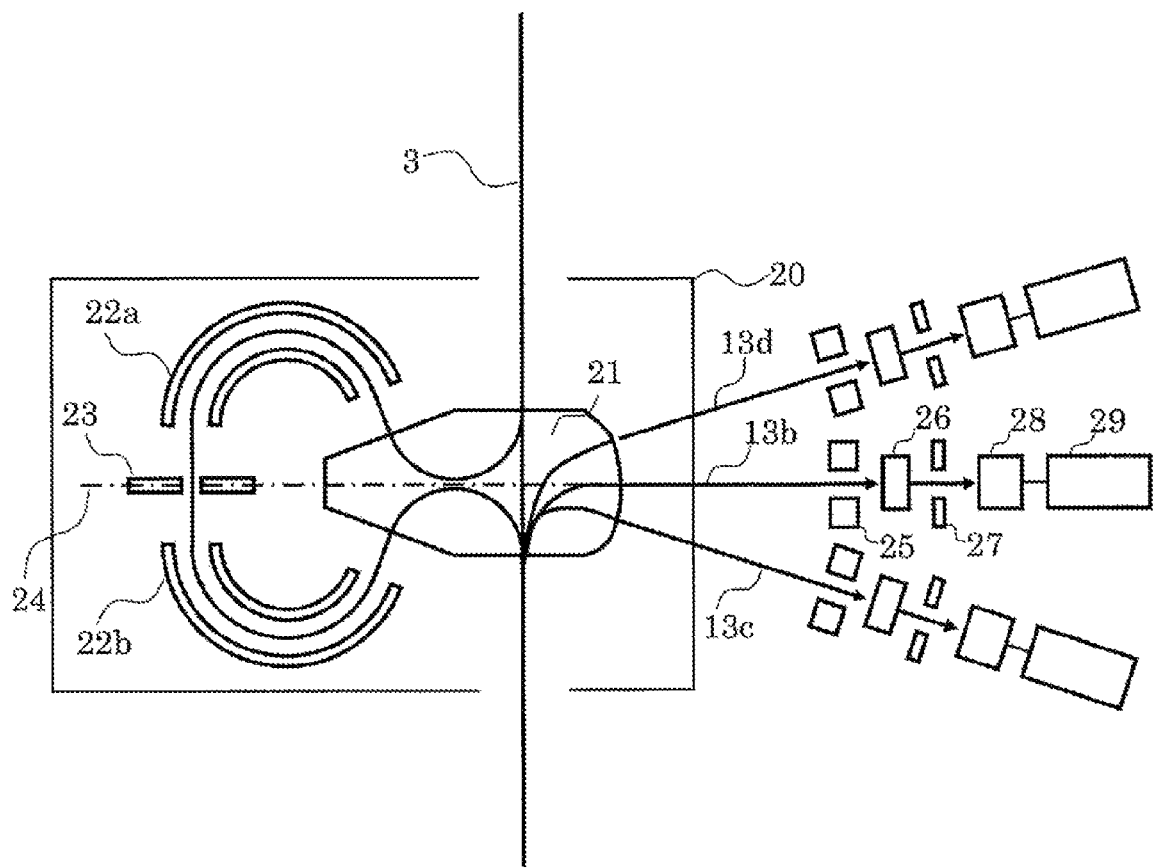
FIG. 2 illustrates an example in which the trajectory of electrons emitted from a sample is deflected by a magnetic field generator of the monochromator.

When the deflecting angle of the magnetic field generator 21 is varied by the energy of the electrons 12b emitted by the sample and the voltage applied to the sample 11, the portion from the auxiliary deflector 25 to the photomultiplier 29 may be configured to be movable in accordance with the deflecting angle, or a plurality of the portions may be disposed with respect to the yoke edge of the magnetic field generator 21, so that the SEM image can be observed at each deflecting angle. FIG. 2 illustrates an example in which a total of three such portions, one on the extension of the symmetrical plane of the monochromator and two above and below the plane, are disposed. However, this is not a limitation; for example, further two such portions may be added to the left and right (vertically in the sheet of the drawing), for a total of five such portions. Alternatively, one or a plurality of CCDs and the like may be used for detection.

An SEM image based on the electrons emitted from the desired solid angle may be observed from the SEM images from the photomultiplier 16 and the photomultiplier 28, using an image process.

Specifically, the conversion electrode 13 is provided with an opening for passing the primary electron beam 3 so that, of the electrons emitted from the sample, the electrons 12a with angles exceeding a certain solid angle from the linear optical axis are caused to collide with the conversion electrode 13, forming an SEM image using the photomultiplier 16. On the other hand, in the photomultiplier 29, an SEM image is formed from electrons 13b at all angles that were emitted from the sample. By eliminating from the SEM image from the photomultiplier 29 the information of the SEM image from the photomultiplier 16 through an image process, only the information of the sample up to a certain solid angle from the linear optical axis can be obtained. The solid angle from the linear optical axis may be arbitrarily adjusted by varying the size of the opening of the conversion electrode 13 for passing the primary electron beam.

Figure 3:
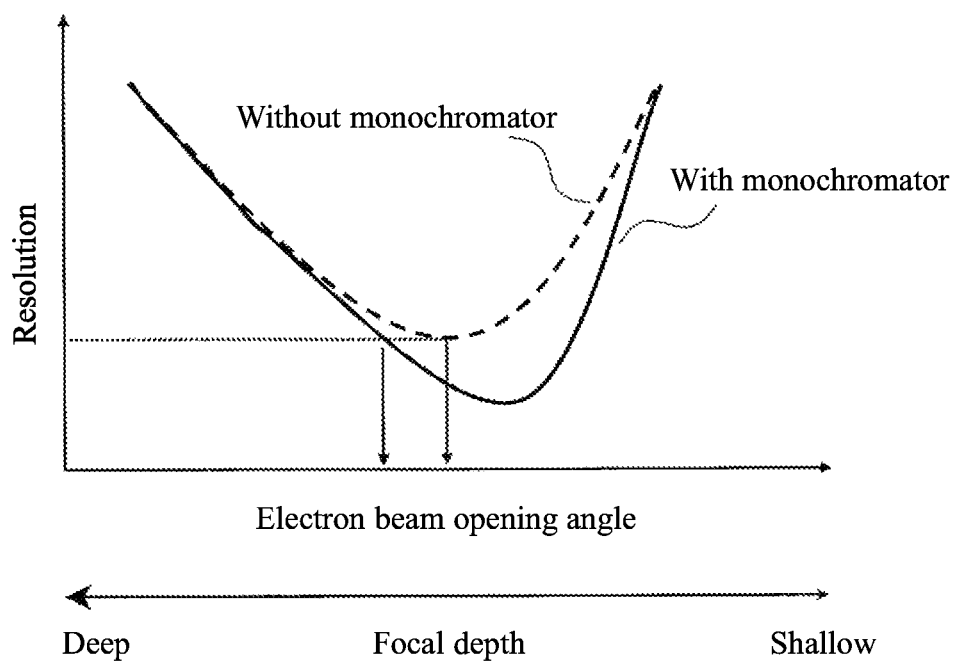
FIG. 3 illustrates the relationship between the electron beam opening angle (focal point depth) and resolution in a case where the monochromator is used and in a case where the monochromator is not used.

FIG. 3 illustrates the relationship between the opening angle (focal point depth) of the primary electron beam incident on the sample and the resolution, when the monochromator is used and when not used. By comparing the SEM image from the photomultiplier 16 (second detector) without the use of the monochromator and the SEM image from the photomultiplier 28 with the use of the monochromator but with the opening angle adjusted such that the resolution is the same as when the monochromator is not used, a difference due to the difference in focal point depth may be indicated. The opening angle may be adjusted by varying the opening diameter of the aperture 6, or by varying the convergence condition of the second convergence lens. In this case, the optical system control device 31 makes an adjustment such that the magnification ratio is not changed.

While low acceleration SEM has been described, similar things may be performed with regard to high acceleration SEM, with the optical system or monochromator conditions adjusted by the electron microscope control device 30.

While the scanning electron microscope provided with the monochromator has been described with reference to a specific embodiment, the present invention is not limited to such embodiment. It should be obvious to those skilled in the art that various modifications or improvements may be made to the configuration or functions of the invention according to the foregoing or other embodiments without departing from the scope of the present invention.

REFERENCE SIGNS LIST

1 Electron source
2 Anode electrode
3 Primary electron beam
3a Expanded primary electron beam
4 First convergence lens
5 First astigmatism correcting lens
6 Aperture
7 Second convergence lens
8 Second astigmatism correcting lens
9 Scanning deflector
10 Objective lens
11 Sample
12a, 12b, 12c, 12d Emitted electron
13 Conversion electrode
14 Electrons produced by conversion electrode
15, 28 Scintillator
16, 29 Photomultiplier
17 Acceleration electrode
18 Electron convergence lens
19, 25 Auxiliary deflector
20 Monochromator
21 Magnetic field generator
22a First electric field generator
22b Second electric field generator
23 Energy selection aperture
24 Symmetrical plane
26 Energy sensitive analyzer
27 Limiting aperture
30 Electron microscope control device
31 Optical system control device
32 Monochromator control device

The invention claimed is:

1. A scanning electron microscope comprising an electron source and a monochromator that makes an electron beam emitted from the electron source monochromatic, wherein:
the monochromator includes a magnetic field generator that deflects the electron beam, and an energy selection aperture that passes a part of the electron beam deflected by the magnetic field generator;
the monochromator is arranged on a trajectory of electrons emitted from a sample when the sample is irradiated with the electron beam that has passed through the monochromator; and
a plurality of detecting elements are arranged on a plurality of trajectories of electrons which are dispersed due to the deflection effect of the monochromator,
wherein each of the plurality of detecting elements includes a first aperture that passes some of electrons emitted from the sample.

2. The scanning electron microscope according to claim 1, wherein:
each of the plurality of detecting elements includes a deflector that deflects the electrons that have passed through the magnetic field generator, and the deflector is disposed between the magnetic field generator and the first aperture.

3. The scanning electron microscope according to claim 1, comprising a second aperture disposed between the magnetic field generator and the sample that limits the passage of those of the electrons emitted from the sample that are in a range of angles greater than a predetermined radiation angle with respect to an optical axis of the electron beam as a center.

4. The scanning electron microscope according to claim 3, wherein the second aperture is a conversion electrode that produces electrons upon collision with the electrons emitted from the sample, the microscope further comprising a second detector that detects the electrons emitted from the conversion electrode.

5. The scanning electron microscope according to claim 3, wherein that the second aperture is a second detector.

6. The scanning electron microscope according to claim 3, comprising:
a second detector that detects the electrons that have collided with the second aperture or the electrons produced by the collision with the second aperture; and
an operating unit that composes an output from the first detector and an output from the second detector.

7. The scanning electron microscope according to claim 1, comprising an energy sensitive analyzer that analyzes an energy of the electrons that have passed through the monochromator.

8. The scanning electron microscope according to claim 1, wherein each of the plurality of detecting elements includes a first detector that detects electrons that have passed through the first aperture.

9. The scanning electron microscope according to claim 1, wherein each of the plurality of detecting elements includes an energy sensitive analyzer that analyzes an energy of the electrons which are dispersed due to the deflection effect of the monochromator.

* * * * *